(12) United States Patent
Taguchi

(10) Patent No.: US 7,169,712 B2
(45) Date of Patent: Jan. 30, 2007

(54) METHOD FOR MANUFACTURING A MICROLENS

(75) Inventor: Takashi Taguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/163,278

(22) Filed: Oct. 12, 2005

(65) Prior Publication Data
US 2006/0079017 A1    Apr. 13, 2006

(30) Foreign Application Priority Data
Oct. 13, 2004 (JP) .............................. 2004-298609

(51) Int. Cl.
*H01L 21/302* (2006.01)
(52) U.S. Cl. ...................... 438/717; 438/724; 438/733; 438/736
(58) Field of Classification Search ................ 438/717, 438/724, 733, 736
See application file for complete search history.

(56) References Cited

U.S. PATENT DOCUMENTS

| | | | |
|---|---|---|---|
| 2004/0146807 A1* | 7/2004 | Lee et al. ................... | 430/311 |
| 2004/0185588 A1* | 9/2004 | Fukuyoshi et al. ........... | 438/22 |
| 2004/0238908 A1* | 12/2004 | Hashimoto .................. | 257/432 |
| 2005/0200960 A1* | 9/2005 | Tang ........................... | 359/619 |
| 2005/0274968 A1* | 12/2005 | Kuo et al. .................... | 257/98 |
| 2006/0067606 A1* | 3/2006 | Towle et al. ................. | 385/14 |

FOREIGN PATENT DOCUMENTS

| JP | H05-136460 A | 6/1993 |
|---|---|---|
| JP | H06-104480 A | 4/1994 |

* cited by examiner

*Primary Examiner*—Nadine Norton
*Assistant Examiner*—Binh X. Tran
(74) *Attorney, Agent, or Firm*—Shinjyu Global IP

(57) ABSTRACT

A method for manufacturing a microlens formed on a semiconductor substrate includes the steps of preparing the semiconductor substrate, forming an insulating film, which has high etching selectivity with the semiconductor substrate, on the semiconductor substrate, forming a first resist layer, which has an opening that exposes a part of the insulating film, on the insulating film, forming a lens forming portion by eliminating a part of the insulting film, using the first resist layer as a mask, forming a second resist layer, which has roughly cylindrical shape, on the lens forming portion surrounded by the insulating film, transforming the second resist layer into a third resist layer that has roughly hemispheric shape by reflowing the second resist later with a heat treatment, and forming a lens on the semiconductor substrate by etching the third resist layer, the semiconductor substrate, and the insulating film simultaneously with anisotropic etching.

15 Claims, 5 Drawing Sheets

(A)

(B)

(C)

(D)

(A)

(B)

(C)

(A)

(B)

(C)

(D)

(A)

(B)

METHOD FOR MANUFACTURING A MICROLENS

BACKGROUND OF THE INVENTION

1. Field of the Invention

The present invention relates to a method for manufacturing a microlens.

A microlens is extensively used in optic devices, such as an optical communication connector and a charge coupled device (CCD) image sensor. The polishing method or the mold method is used to manufacture a normal lens, but other methods, such as the reflow method or the grayscale mask method is generally used to manufacture a microlens. This is because a microlens is minute, compared to a normal lens. The following is a brief explanation of the reflow method. First, a nearly cylindrical resist pattern is formed on a base substrate with photolithography. Then, the resist pattern is fluidized by heating the base substrate, and a nearly hemispheric resist pattern is formed by the surface tension of the fluidized resist pattern. Next, the nearly hemispheric resist pattern and the base substrate are simultaneously etched with anisotropic dry etching. Then a nearly hemispheric pattern is printed on the base substrate, and thus a microlens is formed.

2. Background Information

Japanese Patent Publication JP-A-05-136460 (especially page 4 and FIG. 2), and Japanese Patent Publication JP-A-06-104480 (especially pages 3-5 and FIG. 4), each show a method for manufacturing a microlens.

As the second embodiment of a method for manufacturing a microlens, the Japanese Patent Publication JP-A-05-136460 describes a method for manufacturing a microlens by using a nearly hemispheric resist pattern, which is formed on a base substrate (GaAs) with the potting method, as an etching mask, and by etching the resist pattern and the base substrate simultaneously. Also, the Japanese Patent Publication JP-A-06-104480 describes a method for manufacturing a microlens basically with the hitherto known reflow method. However, a structural feature of the microlens is that the surrounding portion of the microlens is formed so that its height is higher than the top of the microlens. Because of this structure, the microlens is protected from damage caused by external factors. The following is a brief explanation of a method for manufacturing a microlens described in this Japanese Patent Publication. First, a base of a negative resist is formed on the surrounding part of the side of a base substrate (InP) where a microlens is formed. Then, a positive resist is formed on both the base of the negative resist and the central part of the base substrate where a microlens is formed, and the bowl-shaped positive resist is formed by fluidizing the positive resist with a thermal treatment. Next, a microlens is formed by etching this resist pattern and the base substrate simultaneously with anisotropic dry etching. At this time, if the etch selectivity between the positive resist and the base substrate nearly equals one and the etch selectivity between the negative resist and the base substrate nearly equals to three, the height of the surrounding portion of the microlens is formed higher than the top of the microlens.

In the reflow method, the nearly cylindrical resist pattern formed by photolithography is fluidized with a high temperature heat treatment (i.e., a reflow treatment), and it is transformed into a nearly hemispheric resist pattern. In this reflow treatment, some combination of the heat treatment's temperature, the thickness of the resist, and the material of the resist can change the size of the resist pattern at the end of the treatment. Especially, as an example of the size change, it often happens that the size of the resist pattern becomes larger than its desired size because of thermal sag. In this case, there is a possibility that the lens properties will vary and furthermore the miniaturization of the lens will be prevented.

In the method for manufacturing a microlens described in Japanese Patent Publication JP-A-05-136460, the nearly hemispheric resist pattern is formed by the potting method. Therefore, it is thought that the size of the resist pattern in this method tends to vary more widely than that in the reflow method. Also, in the method for manufacturing a microlens described in the Japanese Patent Publication JP-A-06-104480, a heretofore known reflow method is used to form a microlens. Therefore, it is thought that the size of the resist pattern tends to vary.

In view of the above, it will be apparent to those skilled in the art from this disclosure that there exists a need for an improved method for manufacturing a microlens. This invention addresses this need in the art as well as other needs, which will become apparent to those skilled in the art from this disclosure.

SUMMARY OF THE INVENTION

It is therefore an object of the present invention to resolve the above-described problem, and to provide a method for manufacturing a microlens having stable properties and shape.

In accordance with the present invention, a method for manufacturing a microlens formed on a semiconductor substrate comprises the steps of preparing the semiconductor substrate, forming an insulating film, which has high etching selectivity with the semiconductor substrate, on the semiconductor substrate, forming a first resist layer, which has an opening that exposes a part of the insulating film, on the insulating film, forming a lens forming portion by eliminating a part of the insulting film, using the first resist layer as a mask, forming a second resist layer, which has roughly cylindrical shape, on the lens forming portion surrounded by the insulating film, transforming the second resist layer into a third resist layer that has roughly hemispheric shape by reflowing the second resist later with a heat treatment, and forming a lens on the semiconductor substrate by etching the third resist layer, the semiconductor substrate, and the insulating film simultaneously with anisotropic etching.

According to the method for manufacturing a microlens of the present invention, a nearly hemispheric third resist layer is formed by reflowing a second resist layer that is surrounded by an insulating film. Therefore, it is possible to prevent the size of the third resist layer from varying, even if the size of the third resist layer increases due to thermal sag, because the size of the third resist layer is defined by the diameter of a lens forming portion that is surrounded by an insulating film. This makes it possible to manufacture a microlens whose properties and shape are stable.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWING

Referring now to the attached drawings which form a part of this original disclosure.

DETAILED DESCRIPTION OF THE PREFERRED EMBODIMENTS

Figure 1:
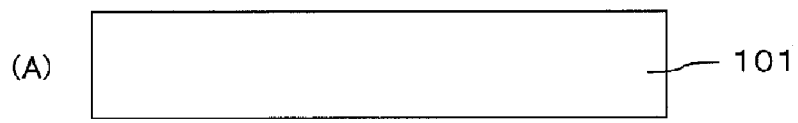
FIG. 1 shows diagrams of the steps in a microlens manufacturing method in accordance with the first embodiment of the present invention.
Figure 1:
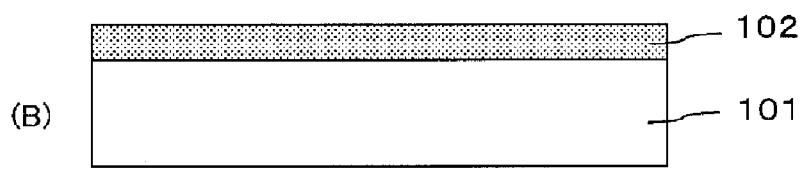
Figure 1:
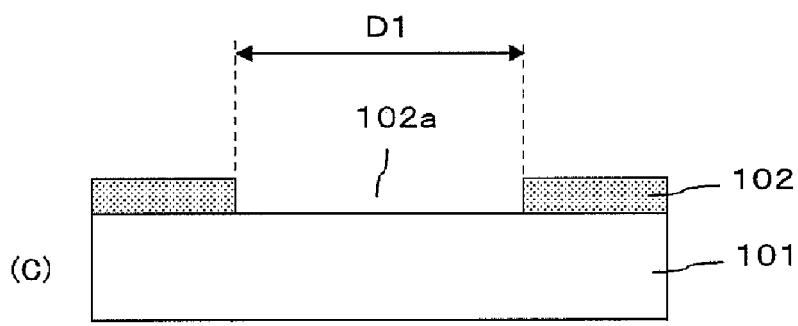
Figure 1:
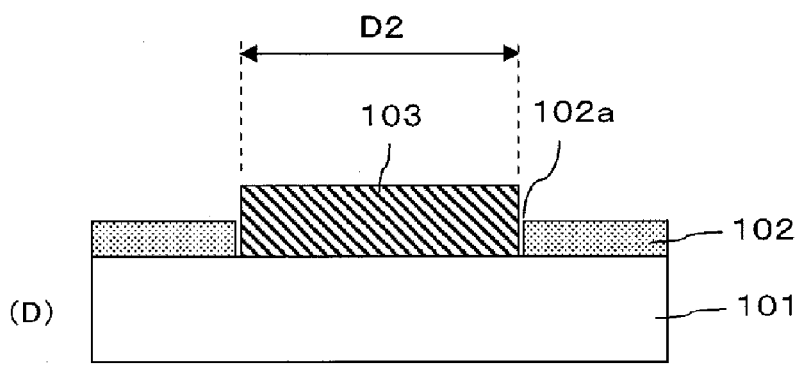

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

First Embodiment

Figure 2:
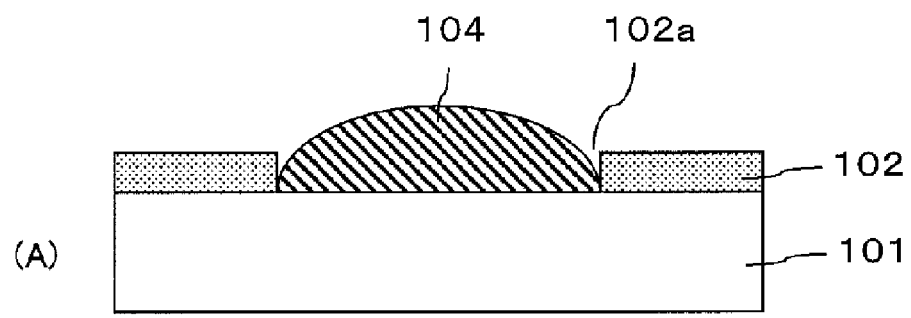
FIG. 2 shows diagrams of the steps in a microlens manufacturing method in accordance with the first embodiment of the present invention.
Figure 2:
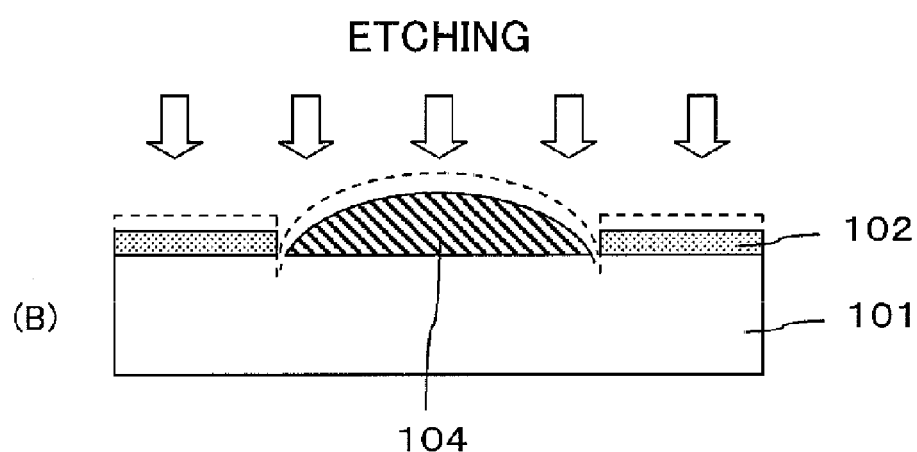
Figure 2:
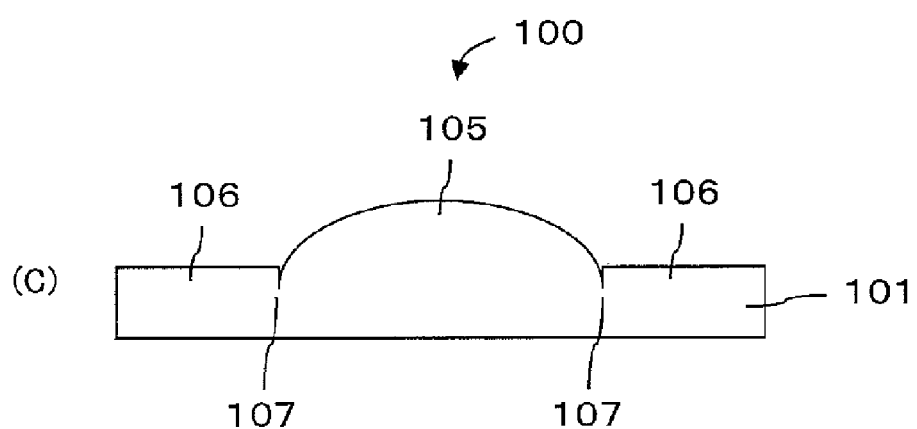

FIGS. 1 and 2 are cross-section diagrams to explain a method for manufacturing a microlens in accordance with the first embodiment of the present invention.

First, as shown in FIG. 1(A), a semiconductor substrate 101 is prepared in order to manufacture a microlens. For example, a silicon substrate is used as the semiconductor substrate 101.

Next, as shown in FIG. 1(B), an insulating film 102 is formed on the semiconductor substrate 101. For example, the thickness of the insulating film 102 is 1 μm. Preferably, the insulating film 102 is made of substance that has an etch selectivity with silicon, which is the substance of the semiconductor substrate 101. For example, a silicon dioxide ($SiO_2$) film or a silicon nitride (SiN) film, which are generally used for manufacturing a semiconductor device, may be used as the substance of the insulating film 102.

Next, as shown in FIG. 1(C), a lens forming portion 102a is formed by etching the insulating film 102 with a heretofore known photolithography etchant, so that it exposes a part of surface of the semiconductor substrate 101. A diameter D1 of the lens forming portion 102a is formed to be larger than a diameter D2 of a resist pattern 103 by Δd, in consideration of the registration between the lens forming portion 102a and the resist pattern 103 that is formed within the lens forming portion 102a in the next process (FIG. 1(D)) and the variation of the size of the resist pattern 103. That is, the diameter D1 of the lens forming portion 102a is expressed in the form of a equation: D1=D2+Δd. Also, as shown in FIG. 1(D), the distance from the left and right sides of the resist pattern 103 to both the left and right sides of the insulating film 102 is Δd/2, respectively. The Δd can be adjusted depending on the size of the diameter D2 of the resist pattern 103. For example, if the resist pattern 103 is formed so that it has a diameter D2 of 100 μm, the value of Δd may be set to be nearly 1 μm.

Next, as shown in FIG. 1(D), a nearly cylindrical resist pattern 103 is formed on a part of the semiconductor substrate 101, which is exposed as the lens forming portion 102a, with a heretofore known photolithography process.

The thickness of the resist pattern 103 can be set depending on the size of the lens to be formed. For example, if a lens is formed so that it has a diameter of nearly 100 μm, the thickness of the resist pattern 103 may be set to be nearly 10 μm. Also, the diameter D2 of the resist pattern 103 may be set according to the size of the lens to be formed.

Next, as shown in FIG. 2(A), a heat treatment is conducted at a temperature higher than the glass transition temperature of the resist, and the nearly cylindrical resist pattern 103 is transformed into a nearly hemispheric resist pattern 104 by reflowing it. For example, as the heat treatment conditions, the temperature and duration of the heat treatment may be set as 170–190° C. and 30–300 seconds, respectively. The conditions may be changed according to the type of resist that is used. In this heat treatment process, the size of the resist pattern 104 does not exceed the diameter D1 of the lens forming portion 102a, even if the size of the resist pattern 104 becomes larger than that of the resist pattern 103 because of thermal sag. This is because the resist pattern 103 is surrounded by the insulating film 102. In other words, the size of the resist pattern 104 is defined by the wall of the insulating film 102.

Next, as shown in FIG. 2(B), the resist pattern 104, the semiconductor substrate 101, and the insulating film 102 are etched simultaneously by anisotropic dry etching, such as reactive ion etching (RIE). For example, a mixed gas of tetrafluomethane ($CF_4$) and oxygen ($O_2$) are used in the etching process. In this etching process, if the mixture ratio of $CF_4$ and $O_2$ is adjusted so that the etch selectivity between the resist pattern 104 and the semiconductor substrate 101 is set to be a value of nearly 1, the resist pattern 104 and the semiconductor substrate 101 are etched at the nearly same ratio. Through the etching process, the nearly hemispheric resist pattern 104 is printed on the semiconductor substrate 101. On the other hand, in the same etching conditions, the etch selectivity of the semiconductor substrate 101 made of silicon and the insulating film 102 made of silicon dioxide film is defined as a value of 5–10. Therefore, the etching process on the area in which the insulating film 102 is formed proceeds slowly. In other words, the insulating film 102 functions as an etching mask toward the semiconductor substrate 101. In general, the smaller the area to be etched, the higher the etching ratio. As shown in FIG. 2(B), a part of the semiconductor substrate 101 is covered with the insulating film 102, which functions as an etching mask toward the semiconductor substrate 101. Because of this, the exposed area of the semiconductor substrate 101 can be decreased, and the lowering of the etching ratio with respect to the semiconductor substrate 101 can be inhibited.

As shown in FIG. 2(C), in the state in which the etching process further proceeds and the resist pattern 104 is completely eliminated, a lens portion 105 is formed which has nearly the same curvature with the resist pattern 104. Also, in the area that was covered with the insulating film 102, a peripheral lens portion 106 is formed so that its height is higher than that of a basolateral lens part 107. Also, if the initial film thickness of the insulating film 102 is set so that it is completely etched in this etching process, a process to eliminate the remaining portion of the insulating film 102 is not needed. Thus, a microlens 100 is formed.

According to the method for manufacturing a microlens of the first embodiment, the nearly hemispheric resist pattern 104 is formed by conducting the reflow in a state in which the surrounding portion of the nearly cylindrical resist pattern 103 is covered with the insulating film 102. Therefore, even if the size of the resist pattern 104 becomes larger than that of the resist pattern 103 because of thermal sag, it is defined according to the diameter D1 of the lens forming portion 102a that is surrounded by the insulating film 102. Because of this, variation in the size of the resist pattern 104 can be inhibited from becoming larger, and a microlens having stable properties and shape can be manufactured. Also, in the process of forming a lens-shaped resist pattern by etching the semiconductor substrate 101 (FIG. 2(B)), the lowering of the etching ratio with respect to the semiconductor substrate 101 can be prevented and the duration of the etching process can be shortened, by forming the insulating film 102 on the surface of the semiconductor substrate 101.

Second Embodiment

Figure 3:
FIG. 3 shows diagrams of the steps in a microlens manufacturing method in accordance with the second embodiment of the present invention.
Figure 3:
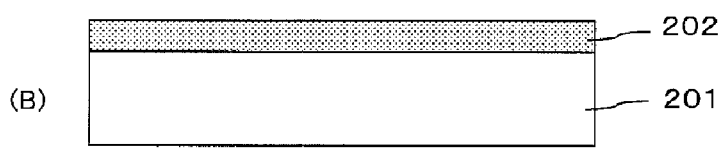
Figure 3:
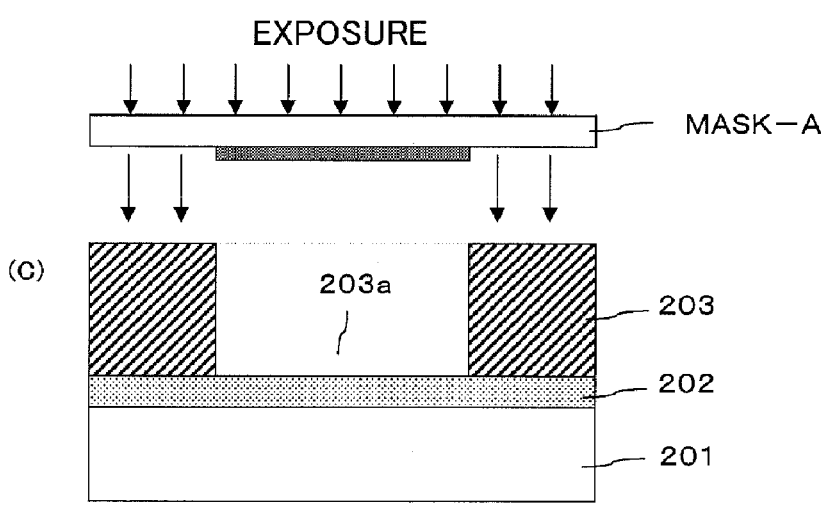
Figure 3:
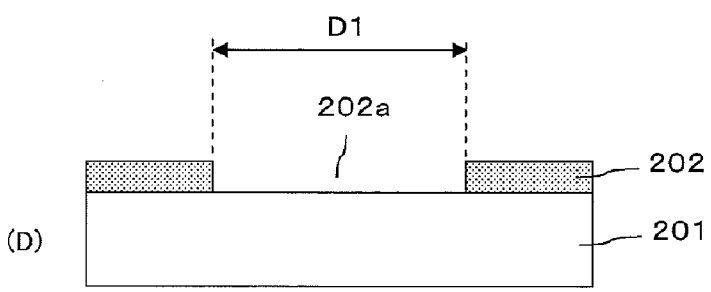
Figure 4:
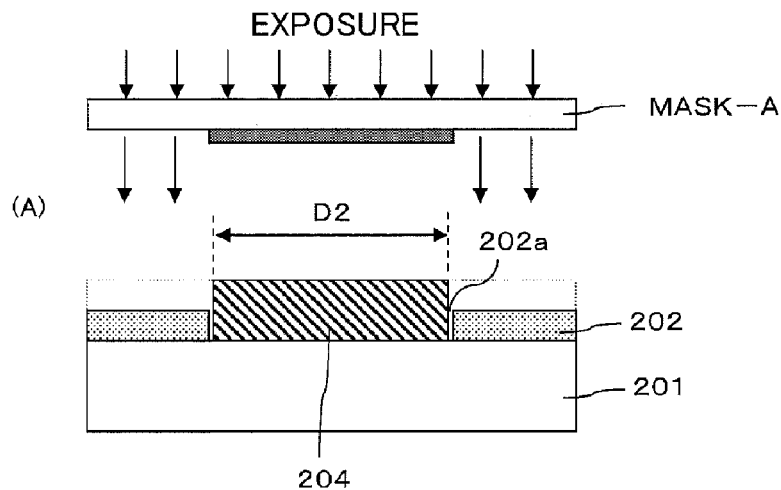
FIG. 4 shows diagrams of the steps in a microlens manufacturing method in accordance with the second embodiment of the present invention.
Figure 4:
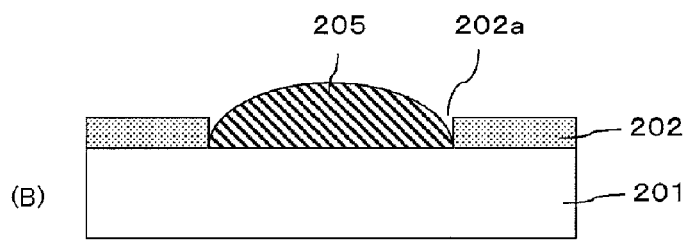
Figure 4:
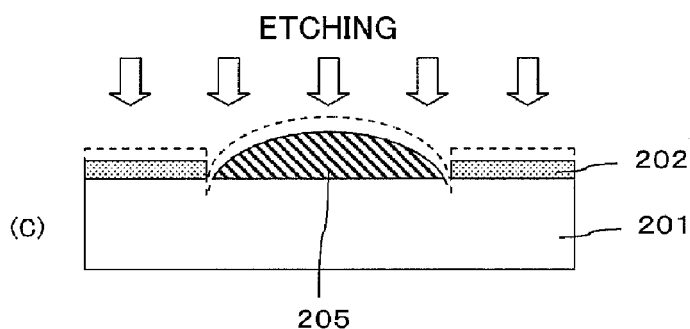
Figure 4:
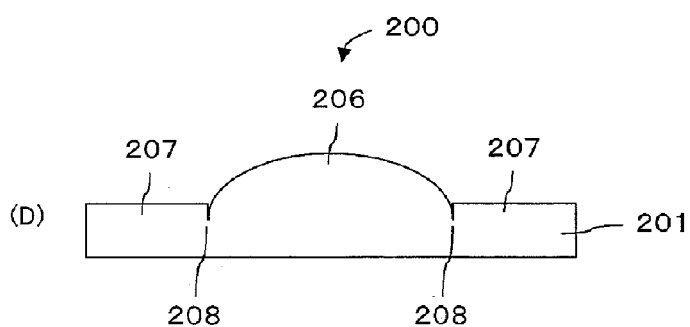

FIGS. 3 and 4 are cross-section diagrams to explain a method for manufacturing a microlens in accordance with the second embodiment of the present invention.

First, as shown in FIG. 3(A), a semiconductor substrate 201 is prepared in order to manufacture a microlens. For example, a silicon substrate is used as the semiconductor substrate 201.

Next, as shown in FIG. 3(B), an insulating film 202 is formed on the semiconductor substrate 201. For example, the thickness of the insulating film 202 is 1 μm. Preferably, the insulating film 202 is made of substance that has an etch selectivity with silicon, which is the substance of the semiconductor substrate 201. For example, a silicon dioxide film ($SiO_2$) film and a silicon nitride (SiN) film, which are generally used for manufacturing a semiconductor device, may be used as the substance of the insulating film 202.

Figure 5:
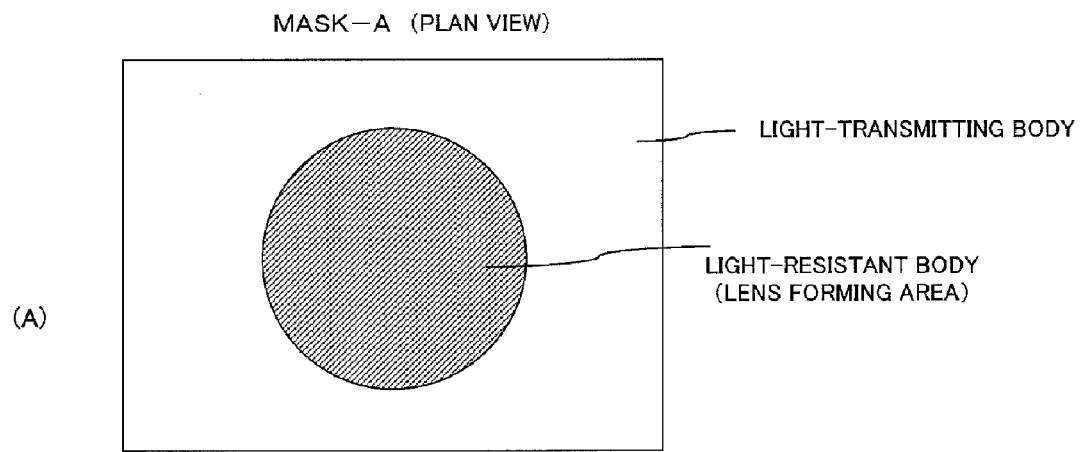
FIG. 5 is a view of diagrams showing two types of photo masks.
Figure 5:
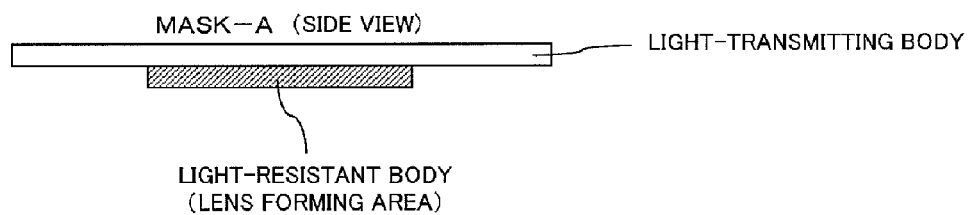
Figure 5:
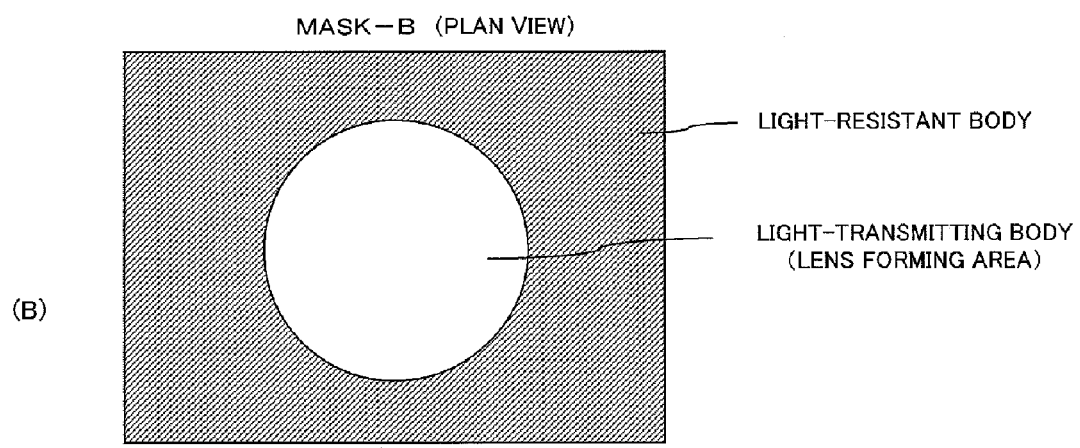
Figure 5:
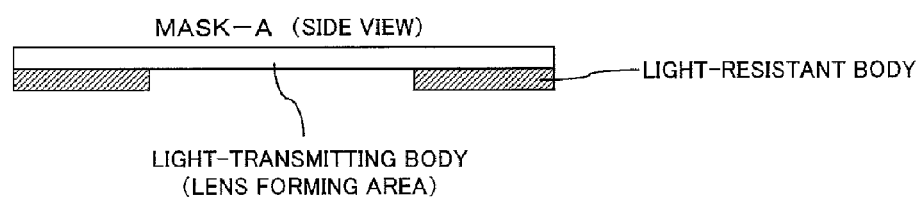

Next, as shown in FIG. 3(C), a negative resist is applied on the insulating film 202, and a exposure process and a development process is conducted with a MASK-A, and a resist pattern 203 with an opening 203a is formed. As shown in FIG. 5(A), the MASK-A is a photo mask that has a light-resistant body in the area corresponding to an area where a lens is formed in the later process (i.e., a lens forming portion 202a shown in FIG. 3(D)). Also, when a negative resist is exposed to light, a chemical reaction is caused in its exposed portion. This chemical reaction makes its exposed portion insoluble toward a developer. Because of this, the exposed portion of the negative resist is left as a resist pattern. Therefore, when an exposure process and a development process are conducted toward the negative resist with the MASK-A, the resist pattern 203, as shown in FIG. 3(C), is formed. It is also possible to form the resist pattern 203 by applying a positive resist on the insulating film 202 and using a MASK-B shown in FIG. 5(B). The MASK-B is a photo mask that has a light-resistant body in the area except for the area where a lens is formed in the later process (i.e., a lens forming portion 202a shown in FIG. 3(D)). Also, when a positive resist is exposed to light, a chemical reaction is caused in its exposed portion. This chemical reaction makes its exposed portion soluble toward a developer. Because of this, the exposed portion of the negative resist is dissolved in a developer and the unexposed portion of it is left as a resist pattern. Therefore, when an exposure process and a development process are conducted toward the positive resist with the MASK-B, the resist pattern 203, as shown in FIG. 3(C), is formed.

Next, as shown in FIG. 3(D), the insulating film 202 is partially eliminated by using the resist pattern 203 as an etching mask, and a lens forming portion 202a is formed which exposes a part of the surface of the semiconductor substrate 201. A diameter D1 of the lens forming portion 202a is formed to be larger than a diameter D2 of a resist pattern 204 by Δd, in consideration of the registration between the lens forming portion 202a and the resist pattern 204 that is formed within the lens forming portion 202a in the next process (FIG. 4 (A)) and the variation of the size of the resist pattern 204. That is, the diameter D1 of the lens forming portion 202a is expressed in the form of an equation: D1=D2+Δd. Also, as shown in FIG. 4(A), the distance from the left and right sides of the resist pattern 204 to both the left and right sides of the insulating film 202 is Δd/2, respectively. The Δd can be adjusted depending on the size of the diameter D2 of the resist pattern 204. For example, if the resist pattern 204 is formed so that it has a diameter D2 of nearly 100 μm, the value of Δd may be set to be nearly 1 μm.

Next, as shown in FIG. 4(A), a positive resist is applied on the semiconductor substrate 201 and the insulating film 202, and an exposure process and a development process are conducted with the MASK-A, which is used for manufacturing the resist pattern 203 (FIG. 3(C)). Through these processes, a nearly cylindrical resist pattern 204 is formed on a part of the semiconductor substrate 201 that is exposed through the lens forming portion 202a. As described above, the MASK-A shown in FIG. 5(A) is a photo mask that has a light-resistant body in the area corresponding to the lens forming portion 202a. Also, the positive resist is a type of resist in which the portion exposed to light is dissolved in a developer because of a chemical reaction in the exposed part, and the portion not exposed to light is left as a resist pattern. Therefore, when an exposure process and a development process are conducted toward the positive resist with the MASK-A, the resist pattern 204 shown in FIG. 4(A) is formed. It is also possible to form the resist pattern 204 by applying a negative resist on the semiconductor substrate 201 and the insulating film 202, and using the MASK-B shown in FIG. 5(B). As described above, the MASK-B is a photo mask that has a light-resistant body in the area except for the area corresponding to the lens forming portion 202a. Also, the negative resist is a type of resist in which the portion exposed to light becomes insoluble toward a developer because of a chemical reaction in the exposed part, and the portion exposed to light is left as a resist pattern. Therefore, when an exposure process and a development process are conducted toward the negative resist with the MASK-B, the resist pattern 204 shown in FIG. 4(A) is formed. The thickness of the resist pattern 204 can be set according to the size of the lens to be manufactured. For example, when a lens with a diameter of nearly 100 μm is manufactured, the thickness of the resist pattern 204 may be set to be nearly 10 μm. Also, the diameter D2 of the resist pattern 204 may be set according to the size of the lens to be manufactured.

Next, as shown in FIG. 4(B), a heat treatment is conducted at a temperature higher than the glass transition temperature of the resist, the nearly cylindrical resist pattern 204 is transformed into the nearly hemispheric resist pattern 205 by reflowing it. For example, as the heat treatment conditions, the temperature and duration of the heat treatment may be set as 170–190° C. and 30–300 seconds, respectively. The conditions may be changed according to the type of resist that is used. In this heat treatment process, the size of the resist pattern 205 does not exceed the diameter D1 of the lens forming portion 202a, even if the size of the resist pattern 205 becomes larger than that of the resist pattern 204 because of thermal sag. This is because the resist pattern 205 is surrounded by the insulating film 202. In other words, the size of the resist pattern 205 is defined by the wall of the insulating film 202.

Next, as shown in FIG. 4(C), the resist pattern 205, the semiconductor substrate 201, and the insulating film 202 are etched simultaneously by anisotropic dry etching, such as reactive ion etching (RIE). For example, a mixed gas of tetrafluoromethane ($CF_4$) and oxygen ($O_2$) are used in the etching process. In this etching process, if the mixture ratio of $CF_4$ and $O_2$ is adjusted so that the etch selectivity between the resist pattern 205 and the semiconductor substrate 201 is set to be a value of nearly 1, the resist pattern 205 and the semiconductor substrate 201 are etched at the nearly same ratio. Through the etching process, the nearly hemispheric resist pattern 205 is printed on the semiconductor substrate 201. On the other hand, in the same etching conditions, the etch selectivity of the semiconductor substrate 201 made of silicon and the insulating film 202 made of silicon dioxide film is defined as a value of 5–10. Therefore, the etching process on the area in which the insulating film 202 is formed proceeds slowly. In other words, the insulating film 202 functions as an etching mask toward the semiconductor substrate 201. In general, the smaller the area to be etched, the higher the etching ratio. As shown in FIG. 4(B), a part of the semiconductor substrate 201 is covered with the insulating film 202, which functions as an etching mask toward the semiconductor substrate 201. Because of this, the exposed area of the semiconductor substrate 201 can be decreased, and the lowering of the etching ratio with respect to the semiconductor substrate 201 can be inhibited.

As shown in FIG. 4(D), in the state in which the etching process further proceeds and the resist pattern 205 is completely eliminated, a lens portion 206 is formed which has nearly the same curvature with the resist pattern 205. Also, in the area that was covered with the insulating film 202, a peripheral lens portion 207 is formed so that its height is higher than that of a basolateral lens part 208. Also, if the initial film thickness of the insulating film 202 is set so that it is completely etched in this etching process, a process to eliminate the remaining portion of the insulating film 202 is not needed. Thus, a microlens 200 is formed.

According to the method for manufacturing a microlens of the second embodiment, the nearly hemispheric resist pattern 205 is formed by conducting the reflow in a state in which the surrounding portion of the nearly cylindrical resist pattern 204 is covered with the insulating film 202. Therefore, even if the size of the resist pattern 205 becomes larger than that of the resist pattern 204 because of thermal sag, it is defined according to the diameter D1 of the lens forming portion 202a that is surrounded by the insulating film 202. Because of this, variation in the size of the resist pattern 205 can be inhibited from becoming larger, and a microlens having stable properties and shape can be manufactured. Also, in the process of forming a lens-shaped resist pattern by etching the semiconductor substrate 201 (FIG. 4(C)), the lowering of the etching ratio with respect to the semiconductor substrate 201 can be prevented and the duration of the etching process can be shortened, by forming the insulating film 202 on the surface of the semiconductor substrate 201. In addition, when different types of resists are used in the process of patterning the insulating film 202 (FIG. 3(C)) and the process of forming the cylindrical resist pattern 204 (FIG. 4(A)) (e.g., when a negative resist is used for patterning the insulating film 202 and a positive resist is used for forming the resist pattern 204), the same type of the photo mask can be used for these processes. Therefore, the number of the photo masks can be decreased, and manufacturing costs can be reduced.

This application claims priority to Japanese Patent Application No. 2004-298609. The entire disclosure of Japanese Patent Application No. 2004-298609 is hereby incorporated herein by reference.

The terms of degree, such as "nearly", used herein mean a reasonable amount of deviation of the modified term such that the end result is not significantly changed. For example, the terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method for manufacturing a microlens formed on a semiconductor substrate, comprising the steps of:
    preparing said semiconductor substrate;
    forming an insulating film, which has high etching selectivity with said semiconductor substrate, on said semiconductor substrate;
    forming a first resist layer, which has an opening that exposes a part of said insulating film, on said insulating film;
    forming a lens forming portion by eliminating a part of said insulating film, using said first resist layer as a mask;
    forming a second resist layer, which has a roughly cylindrical shape, on said lens forming portion, said second resist layer surrounded by said insulating film;
    transforming said second resist layer into a third resist layer that has a roughly hemispheric shape by reflowing said second resist layer with a heat treatment; and
    forming a lens on said semiconductor substrate by etching said third resist layer, said semiconductor substrate, and said insulating film simultaneously with anisotropic etching.

2. The method according to claim 1, wherein said semiconductor substrate is made of silicon.

3. The method according to claim 2, wherein said insulating film is made of either a silicon dioxide ($SiO_2$) film or a silicon nitride (SiN) film.

4. The method according to claim 3, wherein said anisotropic etching is reactive ion etching (RIE).

5. The method according to claim 4, wherein the etch selectivity of said anisotropic etching between said insulating film and said semiconductor substrate is larger than that between said third resist layer and said semiconductor substrate.

6. The method according to claim 5, wherein said anisotropic etching uses a mixed gas of tetrafluoromethane ($CF_4$) and oxygen ($O_2$).

7. The method according to claim 1, wherein the resist type of said first resist layer is opposite that of the resist types of said second resist layer and said third resist layer.

8. The method according to claim 7, wherein a photo mask used to form said first resist layer is the same as the photo mask used to form said second resist layer.

9. The method according to claim 8, wherein said semiconductor substrate is made of silicon.

10. The method according to claim 9, wherein said insulating film is made of either a silicon dioxide ($SiO_2$) film or a silicon nitride (SiN) film.

11. The method according to claim 10, wherein said anisotropic etching is reactive ion etching (RIE).

12. The method according to claim 11, wherein said anisotropic etching has a characteristic that etch selectivity between said insulating film and said semiconductor substrate is larger than that between said third resist layer and said semiconductor substrate.

13. The method according to claim 12, wherein said anisotropic etching uses mixed gas of tetrafluoromethane (CF$_4$) and oxygen (O$_2$).

14. A method for manufacturing a microlens formed on a semiconductor substrate, comprising the steps of:

preparing said semiconductor substrate;

forming an insulating film having high etching selectivity with said semiconductor substrate on said semiconductor substrate;

forming a first resist layer having an opening that exposes a part of said insulating film on said insulating film;

forming a lens forming portion by eliminating a part of said insulating film, using said first resist layer as a mask;

forming a second resist layer, which has a roughly cylindrical shape and a resist type opposite that of said first resist layer, on said lens forming portion, said second resist layer surrounded by said insulating film;

transforming said second resist layer into a third resist layer having a roughly hemispheric shape and a resist type opposite that of said first resist layer by reflowing said second resist layer with a heat treatment; and forming a lens on said semiconductor substrate by etching said third resist layer, said semiconductor substrate, and said insulating film simultaneously with anisotropic etching.

15. A method for manufacturing a microlens formed on a semiconductor substrate, comprising the steps of:

preparing said semiconductor substrate;

forming an insulating film having high etching selectivity with said semiconductor substrate on said semiconductor substrate;

forming a first resist layer having an opening that exposes a part of said insulating film on said insulating film with a first photo mask;

forming a lens forming portion by eliminating a part of said insulating film, using said first resist layer as a mask;

forming a second resist layer, which has a roughly cylindrical shape and a resist type opposite that of said first resist layer, on said lens forming portion with a second photo mask same as said first photo mask, said second resist layer surrounded by said insulating film;

transforming said second resist layer into a third resist layer having a roughly hemispheric shape and a resist type opposite that of said first resist layer by reflowing said second resist layer with a heat treatment; and forming a lens on said semiconductor substrate by etching said third resist layer, said semiconductor substrate, and said insulating film simultaneously with anisotropic etching whose etch selectivity between said insulating film and said semiconductor substrate is larger than that between said third resist layer and said semiconductor substrate.

* * * * *